(12) United States Patent
Artman et al.

(10) Patent No.: US 7,554,803 B2
(45) Date of Patent: Jun. 30, 2009

(54) METHOD AND APPARATUS FOR COOLING AN INFORMATION HANDLING SYSTEM

(75) Inventors: Paul T. Artman, Austin, TX (US); Jerry D. Gandre, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 321 days.

(21) Appl. No.: 11/105,028

(22) Filed: Apr. 13, 2005

(65) Prior Publication Data

US 2006/0232930 A1    Oct. 19, 2006

(51) Int. Cl.
*H05K 7/20*    (2006.01)

(52) U.S. Cl. .................. 361/695; 361/679.49; 454/184

(58) Field of Classification Search ................. 361/695, 361/687, 683, 727, 796, 691, 696; 312/223.1, 312/223.2, 236, 263, 334.28; 165/122, 80.2, 165/121; 174/16.1; 415/178; 454/184
See application file for complete search history.

(56) References Cited

U.S. PATENT DOCUMENTS

| | | | | |
|---|---|---|---|---|
| 5,490,723 A | * | 2/1996 | Driscoll et al. | 312/334.28 |
| 5,816,673 A | * | 10/1998 | Sauer et al. | 312/223.2 |
| 5,912,799 A | * | 6/1999 | Grouell et al. | 361/685 |
| 6,005,770 A | * | 12/1999 | Schmitt | 361/695 |
| 6,135,875 A | * | 10/2000 | French | 454/184 |
| 6,151,213 A | * | 11/2000 | Ater et al. | 361/695 |
| 6,434,018 B1 | * | 8/2002 | Waltz | 361/796 |
| 6,587,340 B2 | * | 7/2003 | Grouell et al. | 361/695 |
| 6,597,569 B1 | * | 7/2003 | Unrein | 361/687 |
| 6,688,965 B1 | * | 2/2004 | Crippen et al. | 454/184 |
| 6,778,386 B2 | | 8/2004 | Garnett et al. | |
| 6,833,995 B1 | * | 12/2004 | Hsue et al. | 361/727 |
| 6,896,612 B1 | * | 5/2005 | Novotny | 454/184 |
| 6,991,533 B2 | * | 1/2006 | Tsai et al. | 454/184 |
| 7,046,513 B2 | * | 5/2006 | Nishiyama et al. | 361/695 |
| 7,286,345 B2 | * | 10/2007 | Casebolt | 361/687 |
| 2003/0042824 A1 | * | 3/2003 | Coffin et al. | 312/223.2 |
| 2005/0168945 A1 | * | 8/2005 | Coglitore | 361/695 |
| 2005/0280986 A1 | * | 12/2005 | Coglitore et al. | 361/687 |

* cited by examiner

*Primary Examiner*—Jayprakash N Gandhi
*Assistant Examiner*—Courtney Smith
(74) *Attorney, Agent, or Firm*—Haynes and Boone, LLP

(57) ABSTRACT

A cooling apparatus includes a chassis, a plurality of heat producing component slots defined by the chassis, and a plurality of valve systems mounted in the chassis, whereby a valve system is positioned adjacent each heat producing component slot. A fan may be coupled to the apparatus and a plurality of heat producing components such as, for example, a plurality of information handling systems, may be positioned in the heat producing components slots and selectively cooled using the plurality of valve systems, depending on the cooling requirements of each individual heat producing component.

15 Claims, 13 Drawing Sheets

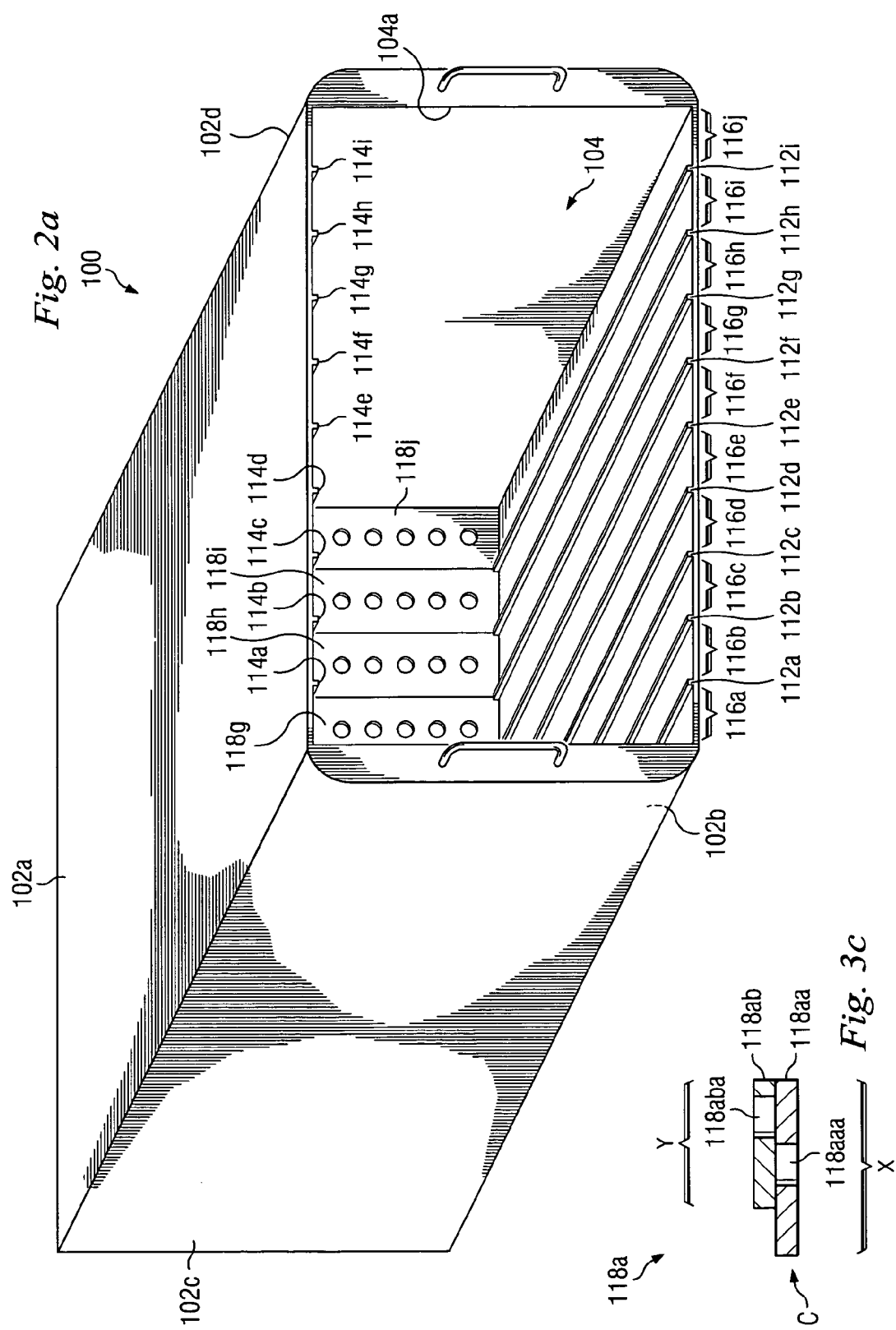

METHOD AND APPARATUS FOR COOLING AN INFORMATION HANDLING SYSTEM

BACKGROUND

The present disclosure relates generally to information handling systems, and more particularly to cooling an information handling system.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Sometimes it is desirable to mount multiple information handling systems to a large chassis in densely packs groups, which can make the cooling requirements of each information handling system difficult to achieve due to the air flow characteristics of the system.

For example, a server might include a plurality of information handling systems mounted in a chassis. In general, the chassis will include a plurality of large fans which are used to produce an system cooling airflow through the information handling systems in the chassis. However, the chassis, the system design, and backplane effects can cause non-optimal airflow distribution between the individual information handling systems. In addition, the fans are typically decoupled from the airflow requirements of each individual information handling system such that changing fan speeds will not distribute system cooling air for optimal cooling of the information handling systems.

Accordingly, it would be desirable to provide for cooling an information handling system absent the disadvantages found in the prior methods discussed above.

SUMMARY

According to one embodiment, a cooling apparatus is provided which includes a chassis, a plurality of heat producing component slots defined by the chassis, and a plurality of valve systems mounted in the chassis, whereby a valve system is positioned adjacent each heat producing component slot.

A principal advantage of this embodiment is that a plurality of heat producing components such as, for example, a plurality of information handling systems, may be positioned in the heat producing component slots and selectively cooled depending on the cooling requirements of each individual heat producing component.

BRIEF DESCRIPTION OF THE DRAWINGS

FIG. 2a is a front perspective view illustrating an embodiment of a chassis.

FIG. 2b is a rear perspective view illustrating an embodiment of the chassis of FIG. 2a.

FIG. 2c is a fragmentary perspective view illustrating an embodiment of the chassis of FIG. 2a.

FIG. 2d is a fragmentary perspective view illustrating an embodiment of the chassis of FIG. 2a.

FIG. 3a is an exploded perspective view illustrating an embodiment of a valve system used with the chassis of FIG. 2a.

FIG. 3b is a perspective view illustrating an embodiment of the valve system of FIG. 3a in a closed position.

FIG. 3c is a cross sectional view illustrating an embodiment of the valve system of FIG. 3b.

FIG. 5b is a perspective view illustrating an embodiment of the heat producing component of FIG. 4 being positioned in the chassis of FIG. 2a during the method of FIG. 5a.

FIG. 5c is a perspective view illustrating an embodiment of the heat producing component of FIG. 4 coupled to the chassis of FIG. 2a during the method of FIG. 5a.

FIG. 5d is a perspective view illustrating an embodiment of a plurality of the heat producing components of FIG. 4 coupled to the chassis of FIG. 2a during the method of FIG. 5a.

FIG. 5e is a cross sectional view illustrating an embodiment of the valve system of FIG. 3b in an intermediate position during the method of FIG. 5a.

FIG. 5f is a perspective view illustrating an embodiment of the valve system of FIG. 3b in an open position during the method of FIG. 5a.

FIG. 5g is a cross sectional view illustrating an embodiment of the valve system of FIG. 5f in an open position during the method of FIG. 5a.

FIG. 6b is a rear perspective view illustrating an embodiment of a heat producing component used with the chassis of FIG. 6a.

FIG. 7b is a cross sectional view illustrating an embodiment of the valve system of FIG. 7a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
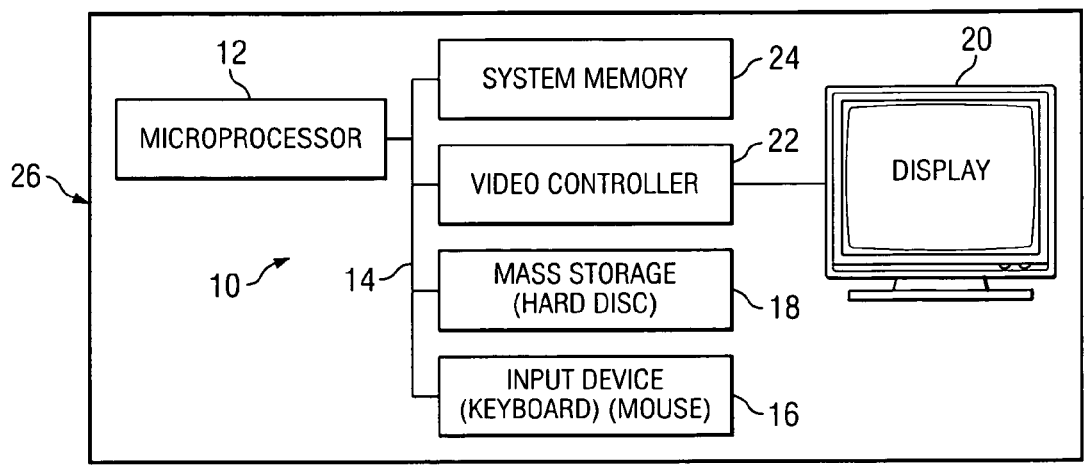
FIG. 1 is a schematic view illustrating an embodiment of an information handling system.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. In an embodiment, a chassis 26 may house some or all of the components of information handling system 10. It should be understood that other busses and intermediate circuits can be deployed between the components described above and microprocessor 12 to facilitate interconnection between the components and the microprocessor.

Referring now to FIGS. 2a, 2b, 2c, and 2d, a chassis 100 which may be, for example, the chassis 26 described above with reference to FIG. 1, is illustrated. Chassis 100 includes a top wall 102a, a bottom wall 102b which is spaced apart from and substantially parallel to the top wall 102a, and a plurality of spaced apart and substantially parallel side walls 102c and 102d which extend between the top wall 102 and the bottom wall 102b. A rear wall 102e extends between the top wall 102a, the bottom wall 102b, and the plurality of side walls 102c and 102d. The top wall 102a, the bottom wall 102b, the plurality of side walls 102c and 102d, and the rear wall 102e define a chassis enclosure 104 having an enclosure entrance 104a located on the chassis 100 opposite the rear wall 102e. A plurality of electrical couplers 106 are mounted to the rear wall 102e and may be electrically coupled to a backplane (not shown) in the chassis 100 which has been omitted for clarity. A plurality of power supplies 108 are coupled to the rear wall 102e which each including a power supply fan 108a which is positioned in a power supply fan aperture 108b that is defined by the power supply 108. A plurality of system fan modules 110 are also coupled to the rear wall 102e, which each including a system fan 110a which is positioned in a system fan aperture 110b that is defined by the system fan module 110, and the plurality of system fan modules are positioned between the plurality of electrical couplers 106 and the plurality of power supplies 108. In an embodiment, the power supplies 108 and the system fan models 110 may be removed from the rear wall 102e of the chassis 100. A plurality of guide members 112a, 112b, 112c, 112d, 112e, 112f, 112g, 112h, and 112i extend from the bottom wall 102b and into the chassis enclosure 104. A plurality of guide members 114a, 114b, 114c, 114d, 114e, 114f, 114g, 114h, and 114i extend from the top wall 102a and into the chassis enclosure 104. The plurality of guide members 112a, 112b, 112c, 112d, 112e, 112f, 112g, 112h, 112i, 114a, 114b, 114c, 114d, 114e, 114f, 114g, 114h, and 114i define a plurality of heat producing component slots 116a, 116b, 116c, 116d, 116e, 116f, 116g, 116h, 116i, and 116j which extend from the bottom wall 102b to the top wall 102b in the chassis enclosure 104. A plurality of valve systems 118a, 118b, 118c, 118d, 118e, 118f, 118g, 118h, 118i, and 118j are mounted in the chassis 110 in a valve system channel 120 and positioned adjacent the heat producing component slots 116a, 116b, 116c, 116d, 116e, 116f, 116g, 116h, 116i, and 116j, respectively. Each valve system 118a, 118b, 118c, 118d, 118e, 118f, 118g, 118h, 118i, and 118j extends between the bottom wall 102b and the top wall 102a and is approximately the width of the adjacent heat producing component slot 116a, 116b, 116c, 116d, 116e, 116f, 116g, 116h, 116i, and 116j, respectively. In an embodiment, a plurality of motors 122 are operably coupled to each of the valve systems 118a, 118b, 118c, 118d, 118e, 118f, 118g, 118h, 118i, and 118j. In an embodiment, the valve systems 118a, 118b, 118c, 118d, 118e, 118f, 118g, 118h, 118i, and 118j may be located at different positions in the chassis 100 between the enclosure entrance 104a and the rear wall 102e.

Figures 3A, 3B:
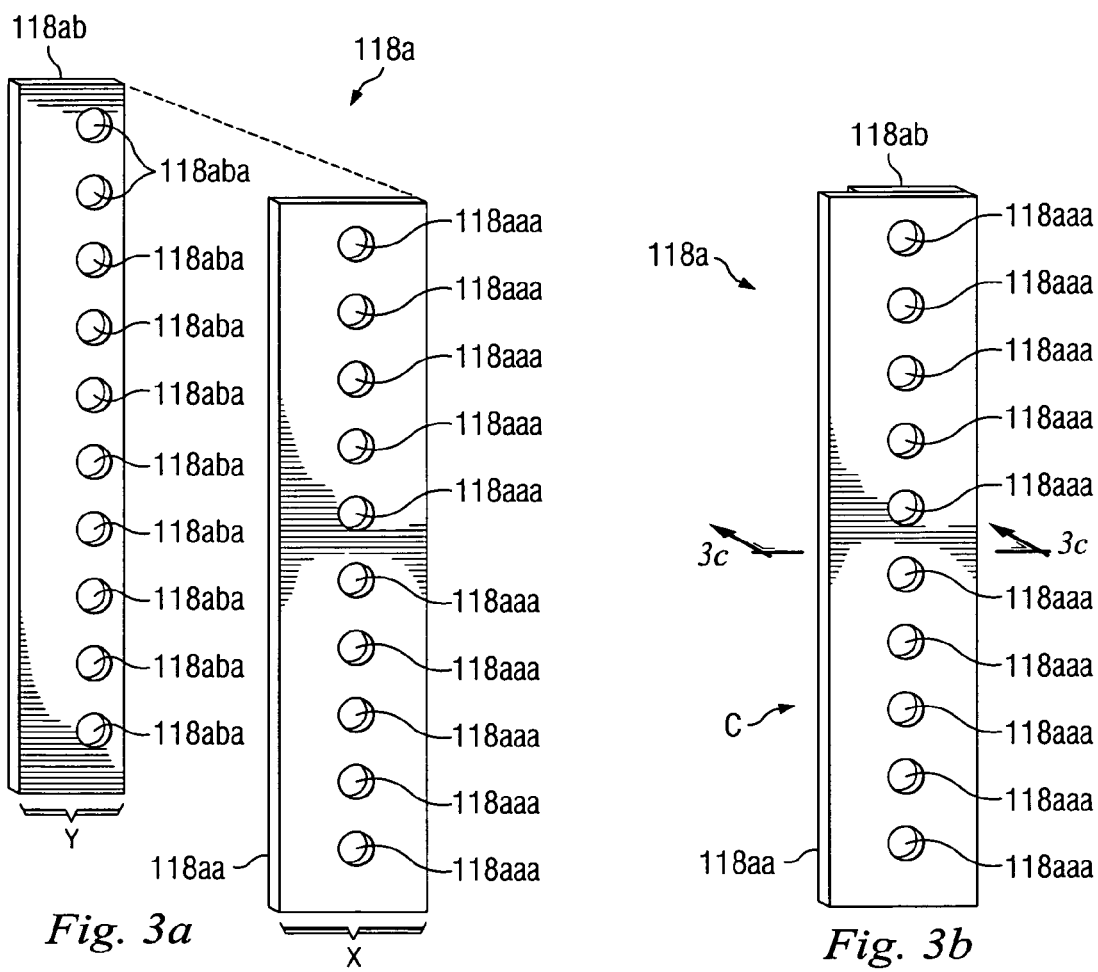
Figure 2B:
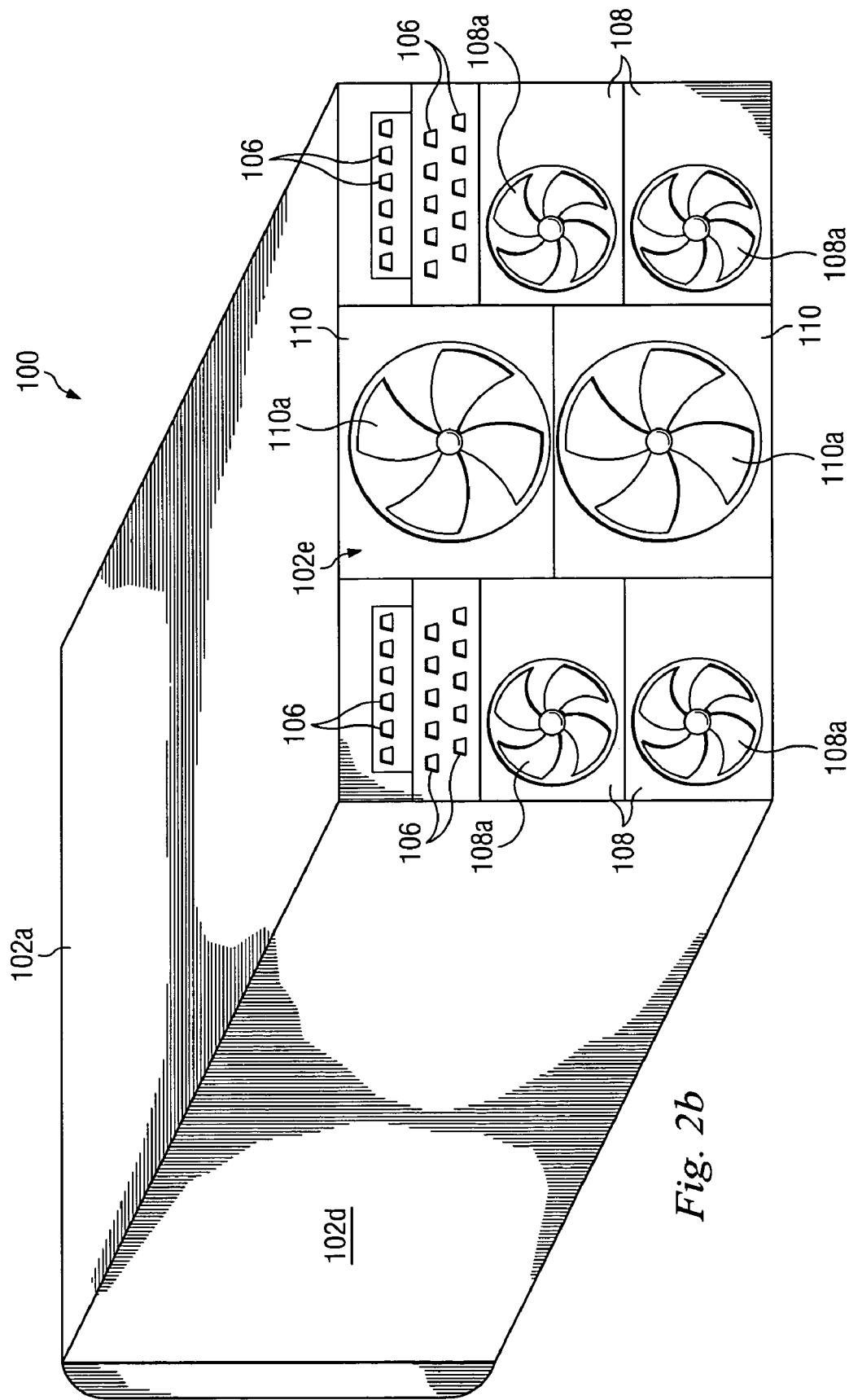
Figure 2C:
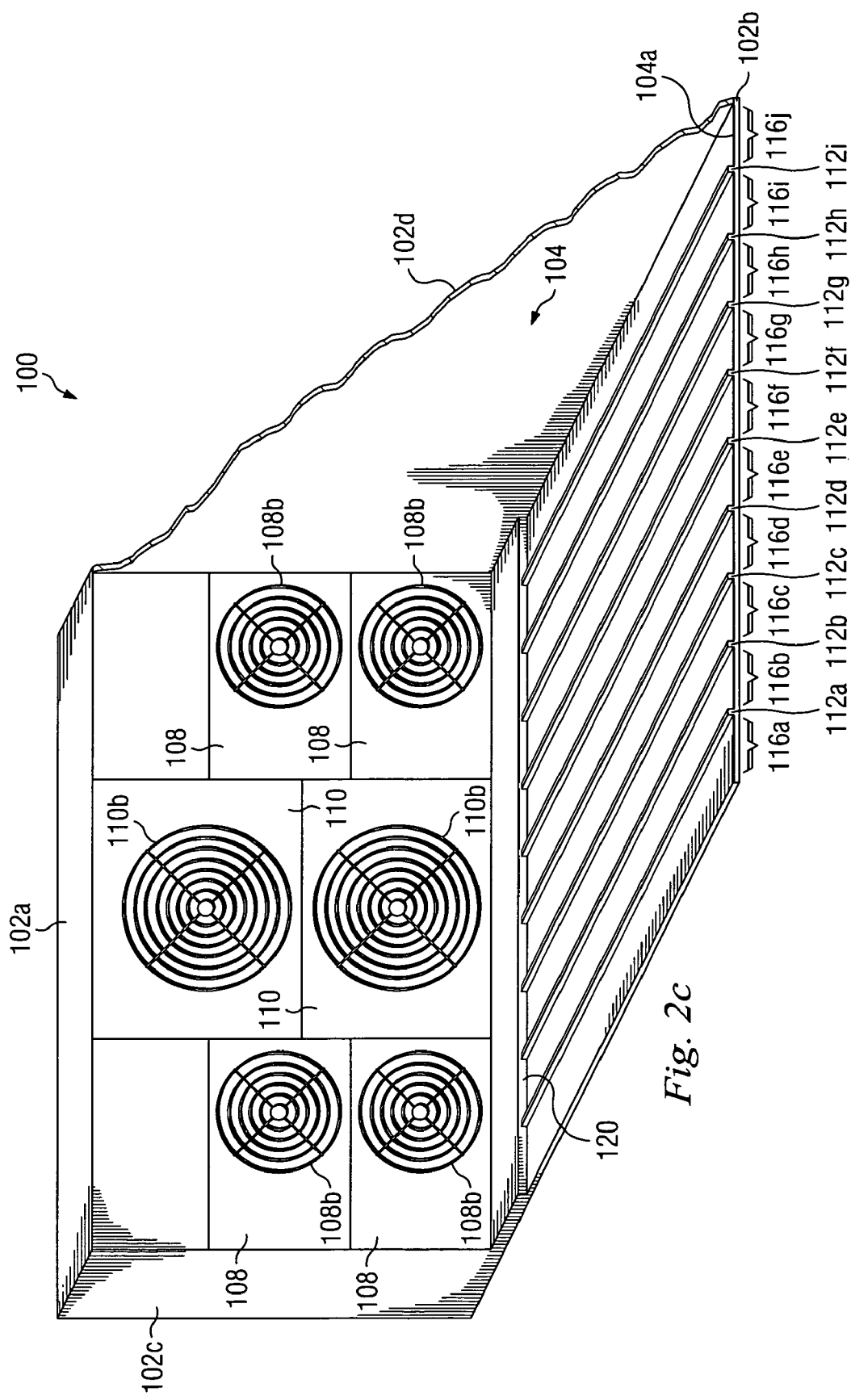
Figure 2D:
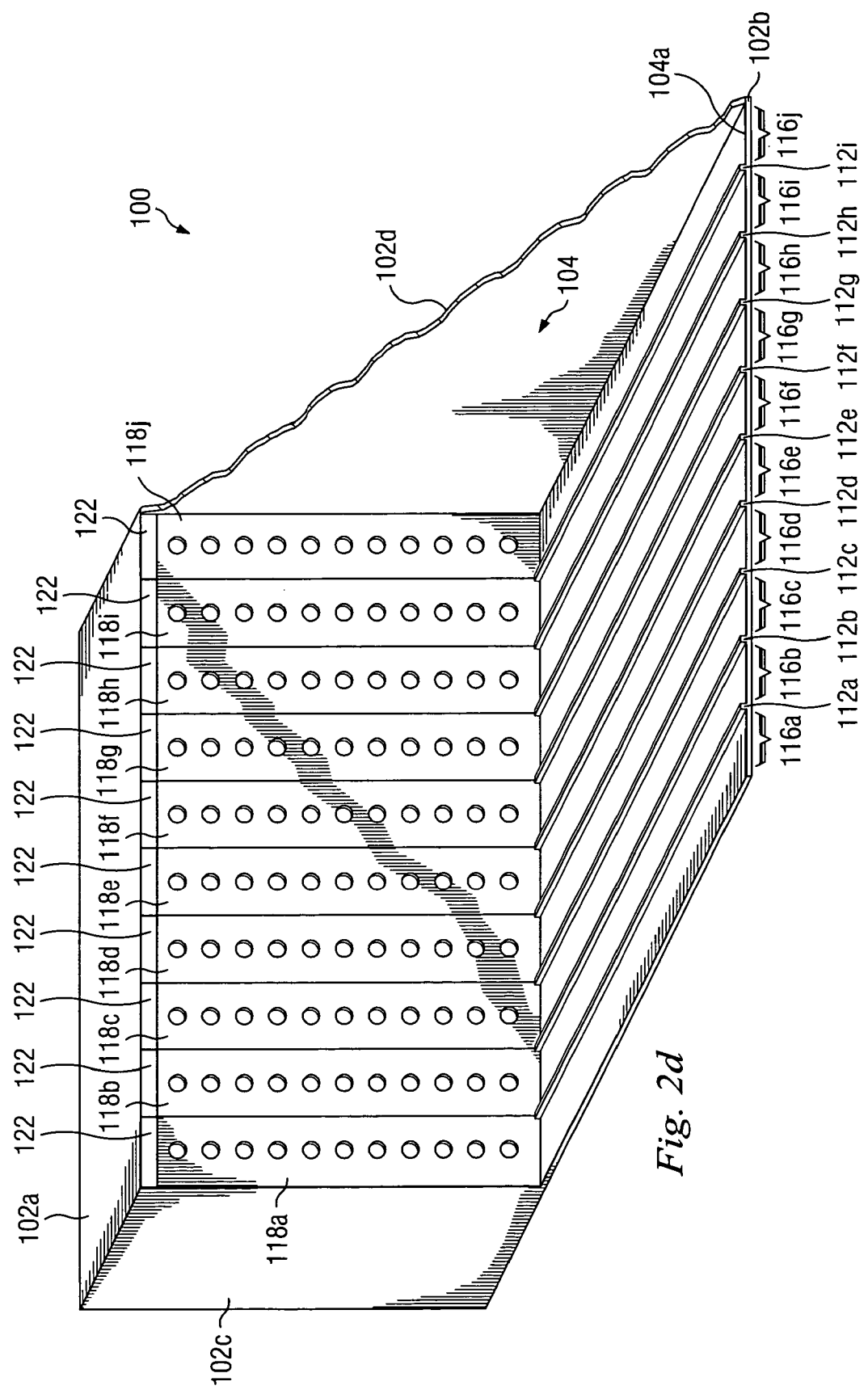

Referring now to FIGS. 3a, 3b, and 3c, the valve system 118a is illustrated in more detail. The valve systems 118b, 118c, 118d, 118e, 118f, 118g, 118h, 118i, and 118j are substantially similar in design and operation to valve system 118a. Valve system 118a includes a first valve member 118aa having a width X. A plurality of apertures 118aaa are defined by the first valve member 118aa and are positioned in a spaced apart relationship and substantially centrally located along its length. Valve system 118a also includes a second valve member 118ab having a width Y which is less than the width X of the first valve member 118aa. A plurality of apertures 118aba are defined by the second valve member 118ab and are positioned in a spaced apart relationship and adjacent a side of the second valve member 118ab. The first valve member 118aa and the second valve member 118ab are slidingly coupled together such that the plurality of apertures 118aaa on first valve member 118aa substantially line up with the plurality of apertures 118aba on second valve member 118ab, and the first valve member 118aa may be moved relative to the second valve member 118ab.

Figure 4:
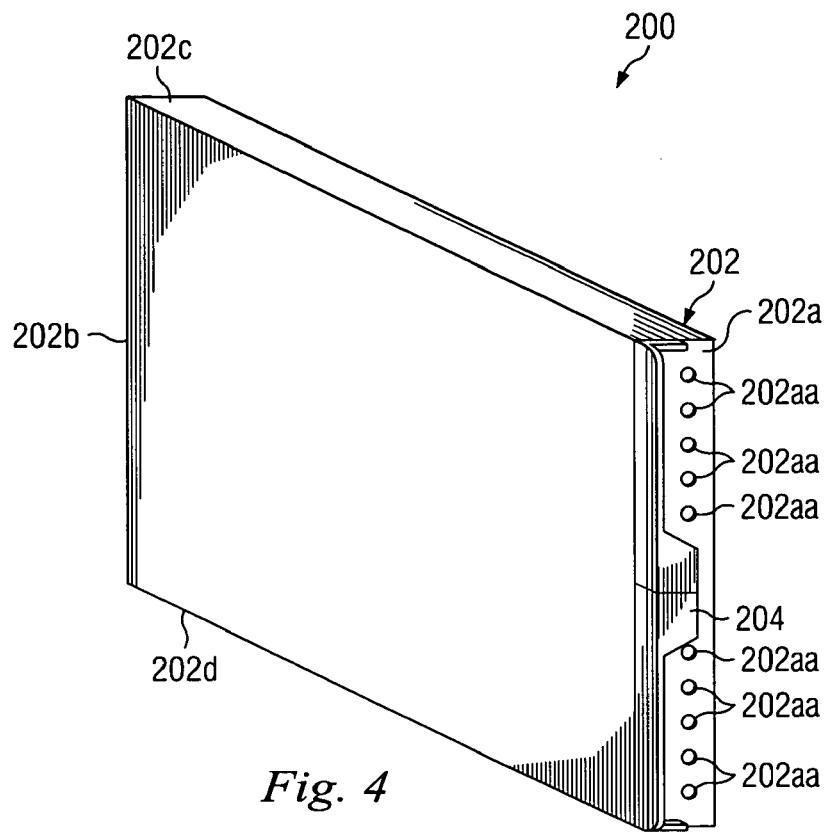
FIG. 4 is a perspective view illustrating an embodiment of a heat producing component.

Referring now to FIG. 4, a heat producing component 200 is illustrated. Heat producing component 200 includes a component housing 202 having a front surface 202a, a rear surface 202b located opposite the front surface 202a, a side surface 202c, and a side surface 202d located opposite the side surface 202c. Front surface 202a defines a plurality of apertures 202aa in the front surface 202a which are operable to allow airflow through the component housing 202. A locking mechanism 204 is positioned on the front surface 202a. In an embodiment, heat producing component 200 may include an information handling system such as, for example, the information handling system 10 illustrated in FIG. 1, or any of the components of the information handling system 10 such as, for example, the mass storage 18 or the system memory 24. In an embodiment, the heat producing component 200 may include a blade or equivalent information handling systems known in the art.

Figure 5A:
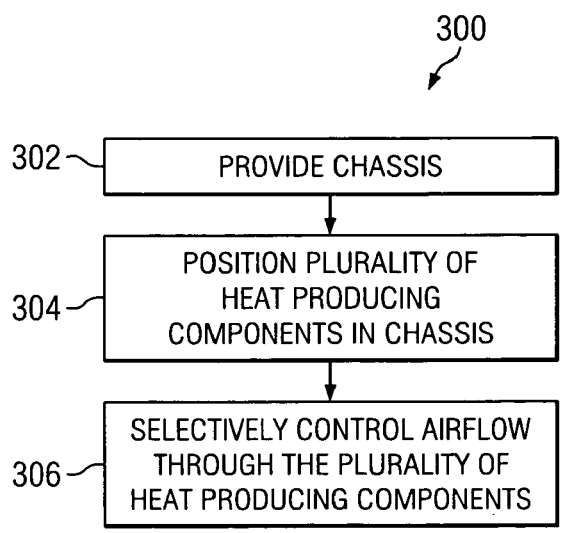
FIG. 5a is a flow chart illustrating an embodiment of a method for cooling an information handling system.
Figure 5B:
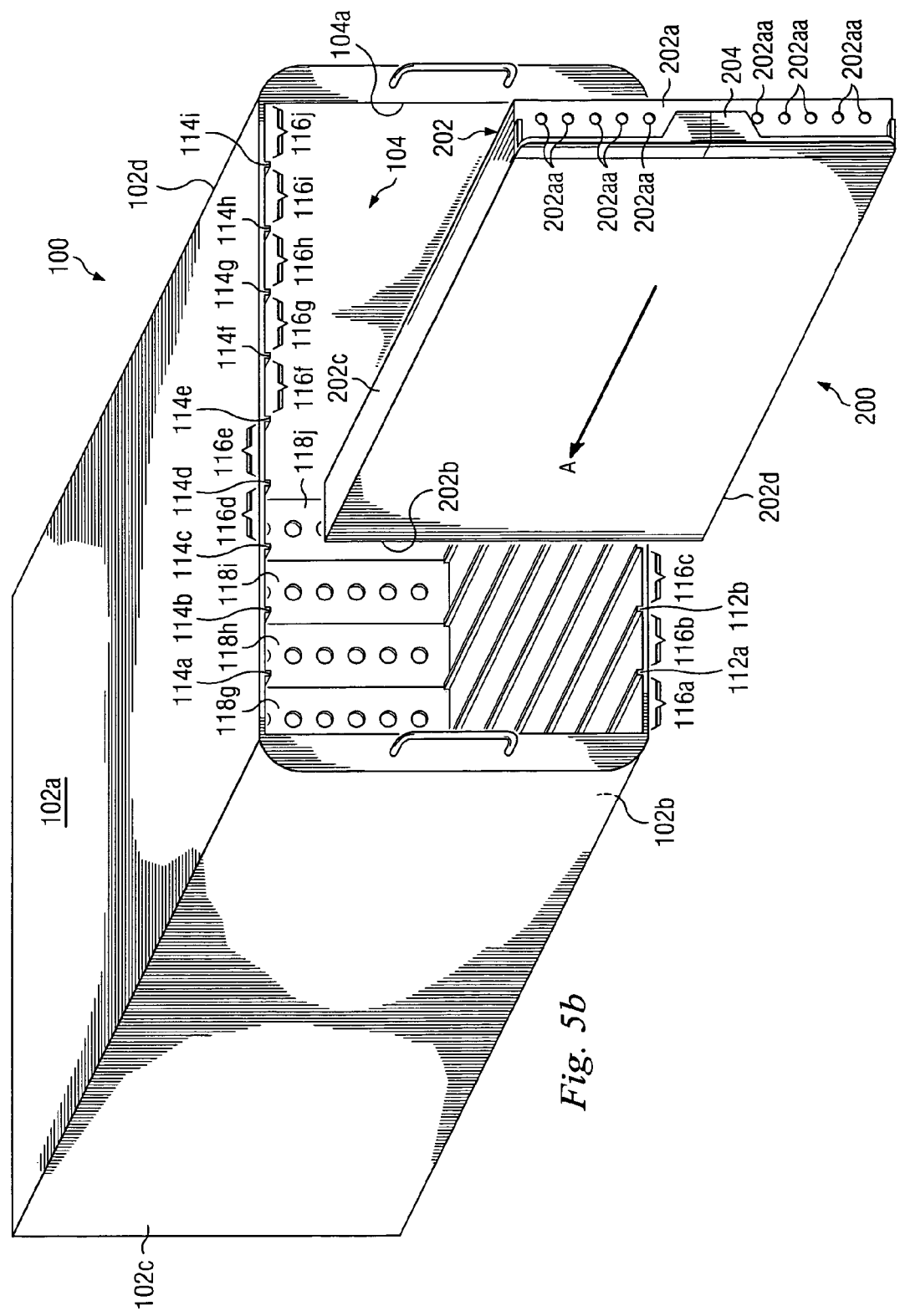
Figure 5C:
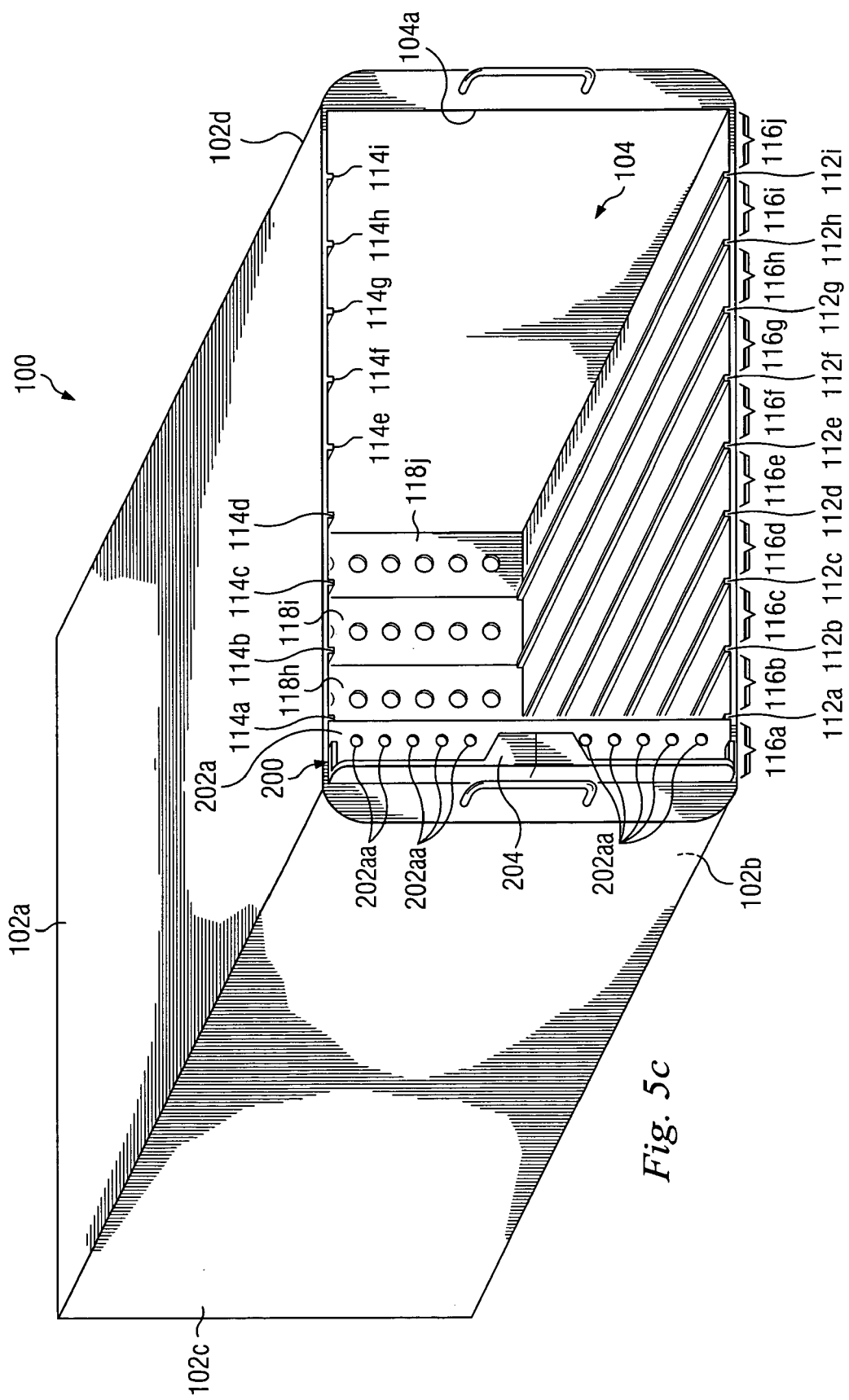
Figure 5D:
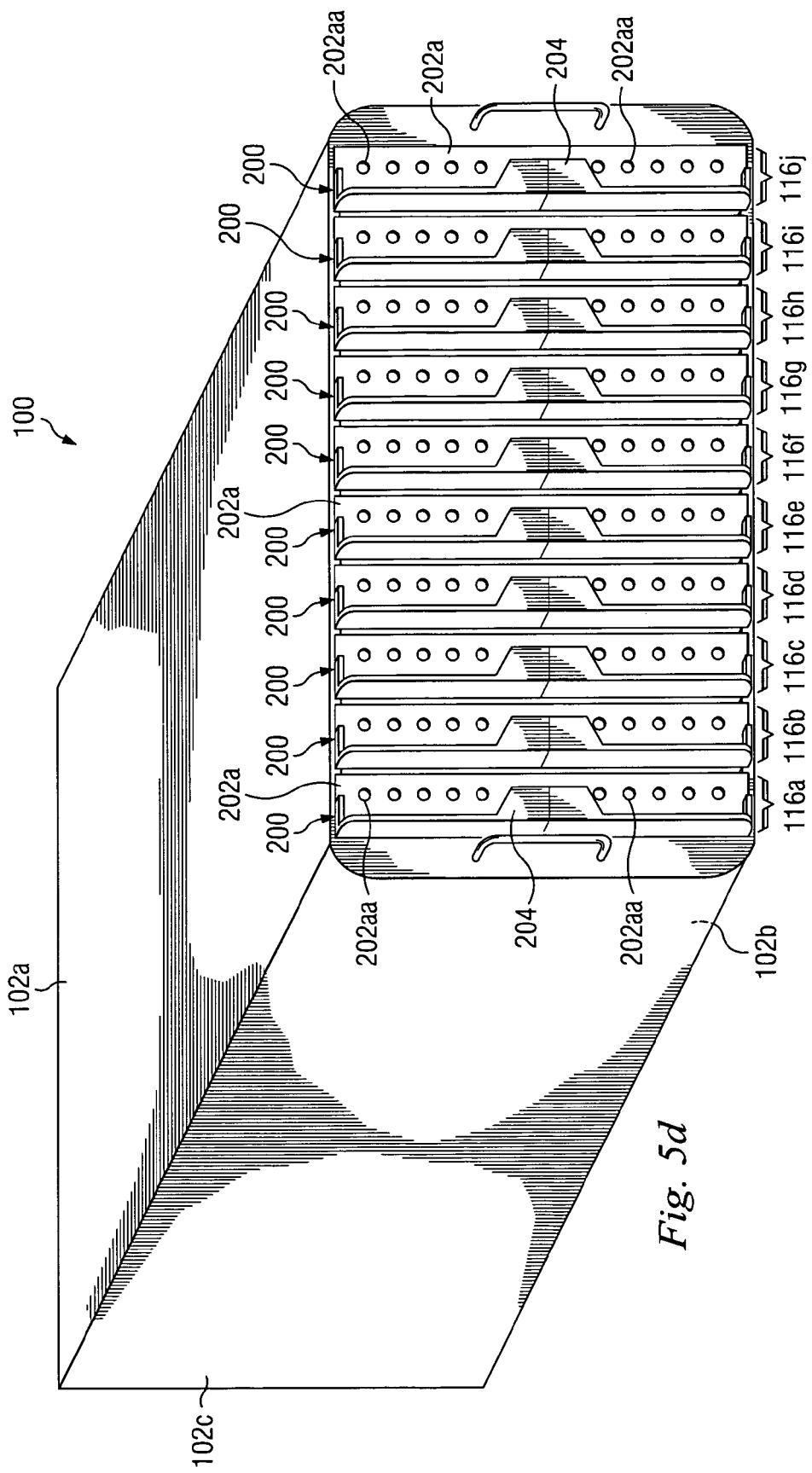
Figure 5E:
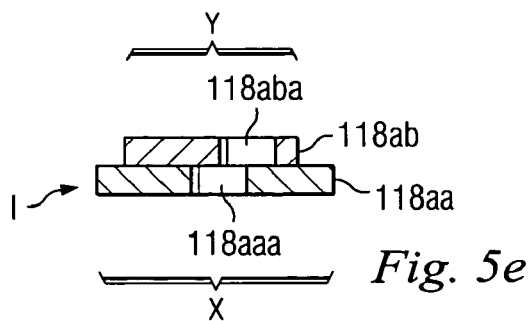
Figure 5F:
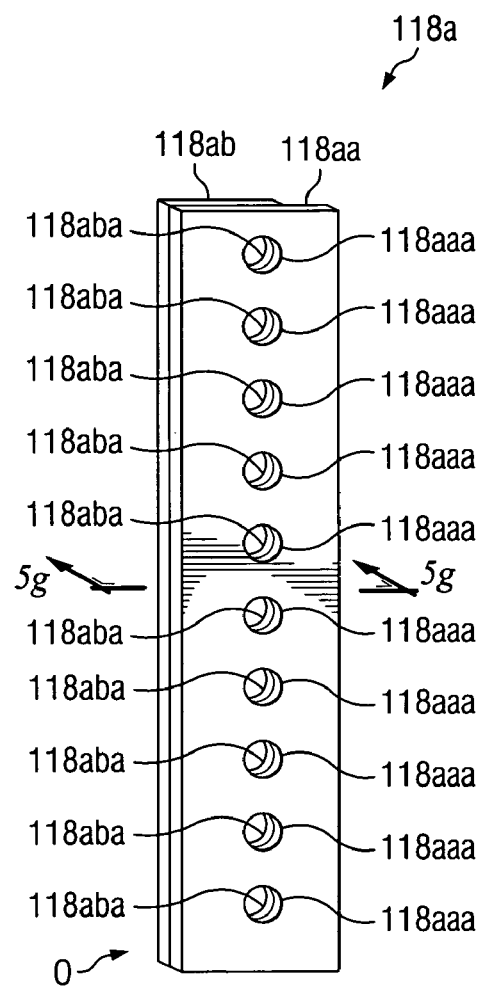
Figure 5G:
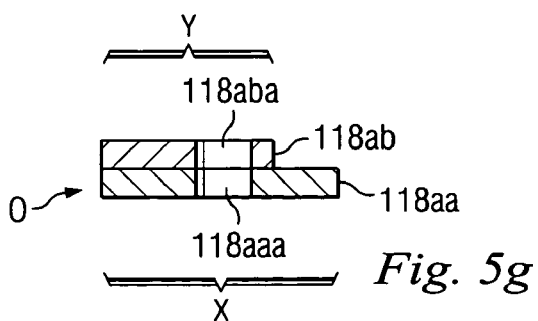

Referring now to FIGS. 2d, 5a, 5b, 5c, and 5d, a method 300 for cooling an information handling system is illustrated which begins at step 302 where the chassis 100 is provided. The method then proceeds to step 304 where a plurality of heat producing components 200 are positioned in the chassis 100. A heat producing component 200 is positioned adjacent the chassis 100 with the rear surface 202b of heat producing component 200 adjacent the enclosure entrance 104 and lined up with heat producing component slot 116a such that side surface 202c is adjacent top wall 102a and side surface 202d is adjacent bottom wall 102b, as illustrated in FIG. 5b. The heat producing component 200 is then moved in a direction A such that it enters the heat producing component slot 116a between the guide members 112a and 114a, which guide the heat producing component 200 into the heat producing component slot 116a. The heat producing component 200 is moved in direction A until it is rear surface 202d is positioned adjacent valve system 118a and front surface 202a is substantially flush with enclosure entrance 104a, as illustrated in FIG. 5c. In an embodiment, a backplane (not shown) may be positioned in the chassis and is operable to be engaged by the heat producing components 200 in order to electrically couple the heat producing components 200 to the chassis 100. The rear surface 202d of the heat producing component 200 is positioned sufficiently adjacent the valve system 118a such that airflow created through the heat producing component 200 in heat producing component slot 116a by the plurality of system fans modules 110 may be controlled by the valve system 118a. In an embodiment, the rear surface 202d of the heat producing component 200 engages the valve system 118a. A plurality of heat producing components 200 may be positioned in the chassis enclosure 104 in heat producing components slots 116b, 116c, 116d, 116e, 116f, 116g, 116h, 116i, and 116j in the same manner as described above for positioning heat producing component 200 in heat producing component slot 116a, as illustrated in FIG. 5d.

Referring now to FIGS. 2b, 2c, 2d, 3b, 3c, 5a, 5d, 5e, 5f, and 5g, the method 300 proceeds to step 304 where the airflow through the plurality of heat producing components 200 is selectively controlled. The valve system 118a is operable to be configured by, for example, the motor 122, into a closed position C, illustrated in FIGS. 3b and 3c, in which the apertures 118aba on valve member 118ba are completely offset from the apertures 118aaa on valve member 118aa and air cannot flow through the valve system 118a. The valve system 118a is also operable to be configured by, for example, the motor 122, into an intermediate position I, illustrated in FIG. 5e, by moving the valve member 118ab relative to valve member 118aa such that the apertures 118aba on valve member 118ba are partially overlapping with the apertures 118aaa on valve member 118aa and air is allowed to flow through the valve system 118a at a rate less than the maximum rate. The valve system 118a is further operable to be configured by, for example, the motor 122, into an open position O, illustrated in FIG. 5e, in which the apertures 118aba on valve member 118ba are substantially coaxial with the apertures 118aaa on valve member 118aa and air is allowed to flow through the valve system 118a at the maximum rate. In an embodiment, the intermediate position I may be any position between the closed position C and the open position O. In an embodiment, the valve system 118a may be controlled manually. The valve systems 118b, 118c, 118d, 118e, 118f, 118g, 118h, 118i, and 118j are substantially similar in design and operation to the valve system 118a. Because the valve systems 118a, 118b, 118c, 118d, 118e, 118f, 118g, 118h, 118i, and 118j are adjacent the heat producing components 200 positioned in heat producing components slots 116a, 116b, 116c, 116d, 116d, 116e, 116f, 116g, 116h, 116i, and 116j, the airflow through each heat producing component 200 may be optimized by configuring the appropriate valve system in the appropriate configuration. For example, heat producing components 200 may be positioned in heat producing component slots 116a, 116e, and 116i, with the remaining heat producing component slots left empty and heat producing component 200 in heat producing component slot 116e producing more heat than heat producing components 200 in heat producing component slots 116a and 116i because of, for example, heat producing component 200 in heat producing component slot 116e including more memory than the heat producing components 200 in heat producing component slots 116a and 116i. Valve system 118b, 118c, 118d, 118f, 118g, 118h, and 118j may then be configured in the closed position C, while valve systems 118a and 118i may be configured in the intermediate position I, and valve system 118e may be configured in the open position O, in order to optimize the airflow through the heat producing components 200 produced by the plurality of system fan modules 110. The airflow may then be created by activating the system fan modules 110, which cause air to be drawn into the heat producing components 200 through the plurality of apertures 202aa in the front surfaces 202a, through the components housing 202, through the valve systems 118a, 118e, and 118i, into the system fan modules 110, and out of the chassis 100. Furthermore, a control system may be instituted for the valve systems 118a, 118b, 118c, 118d, 118e, 118f, 118g, 118i, and 118j and coupled to the plurality of heat producing components 200 in order to dynamically adjust the valve systems 118a, 118b, 118c, 118d, 118e, 118f, 118g, 118i, and 118j in response to changing cooling needs for the plurality of heat producing components 200. Thus, an apparatus is provided for selectively cooling a plurality heat producing components 200.

Figure 6A:
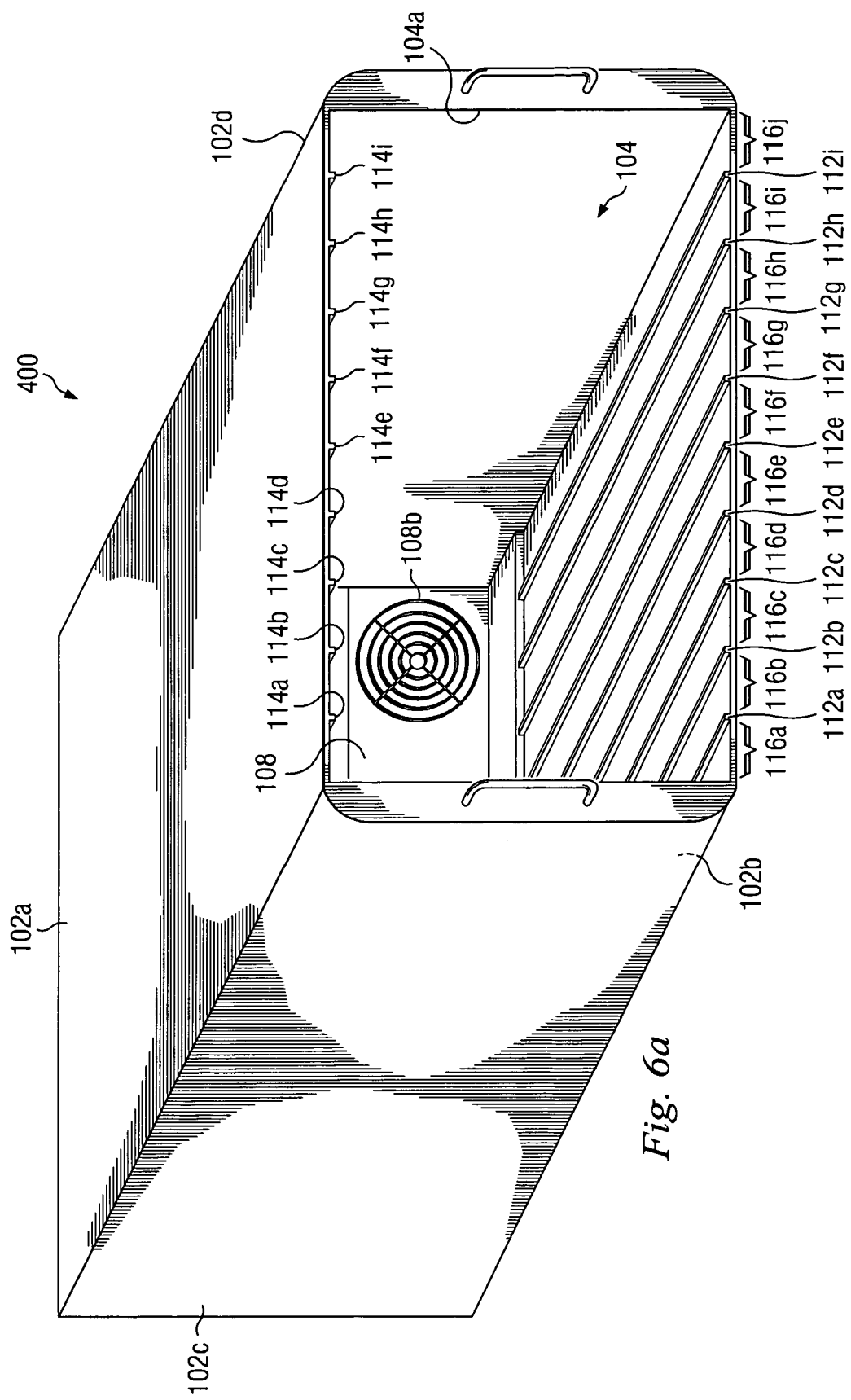
FIG. 6a is a perspective view illustrating an embodiment of a chassis.
Figure 6B:
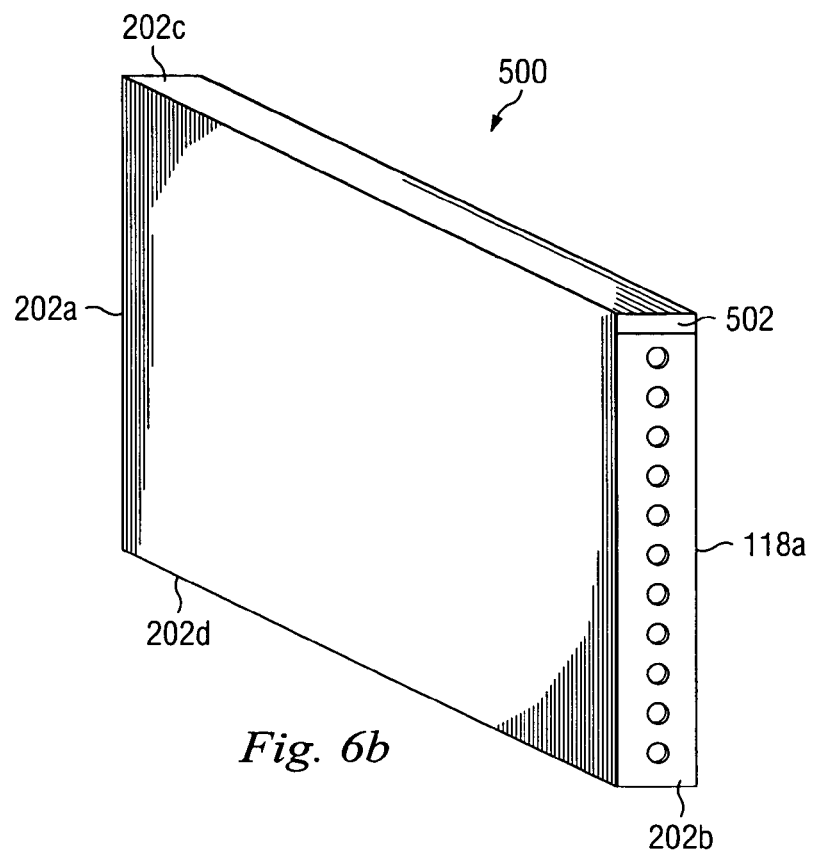

Referring now to FIGS. 2b, 2c, 6a, in an embodiment, a chassis 400 is substantially similar in design and operation to the chassis 100, described above with reference to FIGS. 2a, 2b, 2c, and 2d, with the removal of the plurality of valve systems 118a, 118b, 118c, 118d, 118e, 118f, 118g, 118h, 118i, and 118j, the valve system channel 120, and the plurality of motors 122.

Referring now to FIGS. 3a, 3b, 3c, 4, and 6b, in an embodiment, a heat producing component 500 is substantially similar in design and operation to the heat producing component 200, described above with reference to FIG. 4, with the provision of the valve system 118a, illustrated in FIGS. 3a, 3b, and 3c, mounted on the rear surface 202b of heat producing component 500. A motor 502 is operably coupled to the valve system 118a. In an embodiment, the valve system 118a may be located at different positions in the heat producing component 500 between the front surface 202a and the rear surface 202b of the heat producing component 500.

In operation, a plurality of heat producing components 500 may be positioned in the chassis 400 using step 304 of the method 300 in substantially the same manner as described above with reference to FIGS. 5a, 5b, 5c, and 5d. However, during the step 306 of the method 300, the airflow through the plurality of heat producing components 500 may be selectively controlled by the valve system 118a mounted to each heat producing component 500, as described with reference to FIGS. 5e, 5f, and 5g. In an embodiment, in the event a heat producing component 500 is not positioned in one or more of the heat producing component slots 116a, 116b, 116c, 116d, 116e, 116f, 116g, 116h, 116i, and/or 116j, a temporary wall may be provided to block airflow through that heat producing component slot in order to allow optimization of the airflow through the heat producing components 500.

Figure 7A:
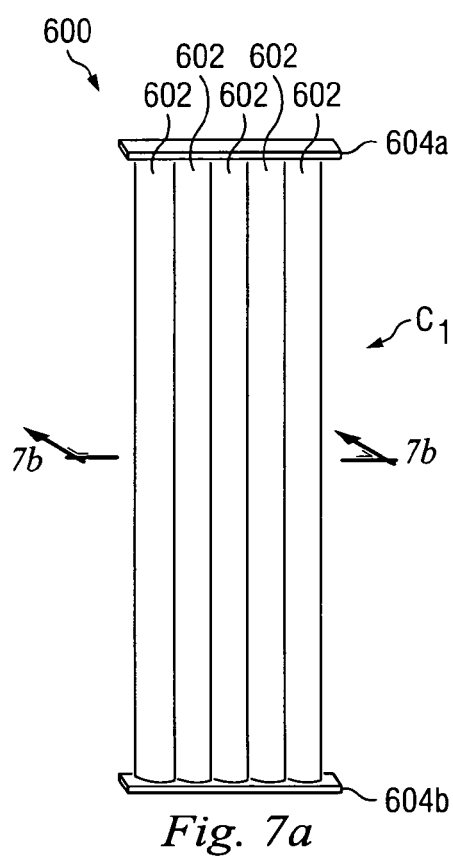
FIG. 7a is a front view illustrating an embodiment of a valve system in a closed position.
Figure 7B:
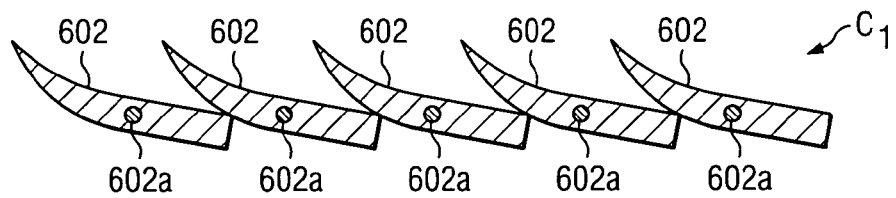
Figure 7C:
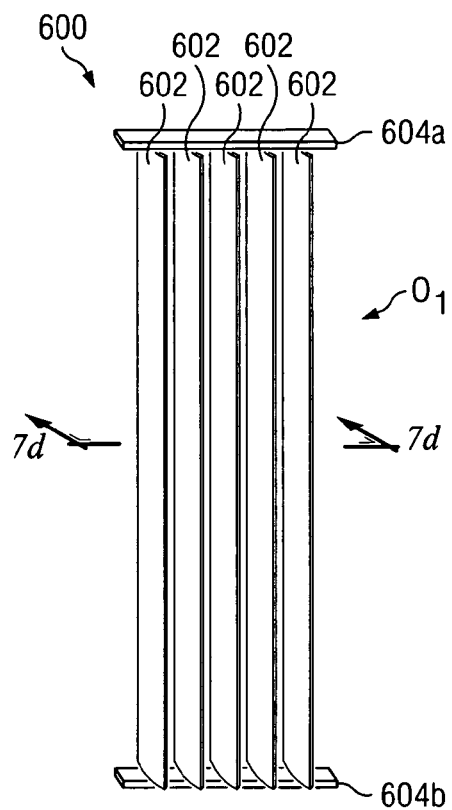
FIG. 7c is a front view illustrating an embodiment of the valve system of FIG. 7a in an open position.
Figure 7D:
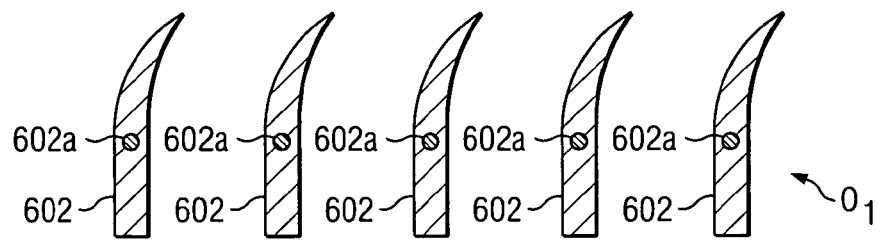
FIG. 7d is a cross sectional view illustrating an embodiment of the valve system of FIG. 7c.

Referring now to FIGS. 7a and 7b, an embodiment of a valve system 600 is illustrated which may replace, for example, any or all of the plurality of valve systems 118a, 118b, 118c, 118d, 118e, 118f, 118g, 118i, and/or 118j. Valve system 600 includes a plurality of valve members 602, each which are rotatably coupled to a top support 604a and a bottom support 604b by a rotating member 602a which is centrally located along the length of the valve member 602. In operation, the plurality of valve members 602a may begin in a closed position $C_1$, illustrated in FIGS. 7a and 7b, with each valve member 602 engaging an adjacent valve member 602 such that airflow is not allowed past the plurality of valve members 602. The plurality of valve members 602 may then be rotated into an open position $O_1$, illustrated in FIGS. 6c and 6d, with each valve member 602 disengaged from its adjacent valve members 602 such that airflow is allowed through the plurality of valve members 602. The plurality of valve members 602 may be rotated to a position anywhere between the closed position $C_1$ and the open position $O_1$ in order to allow an intermediate amount of airflow through the valve system 600. In an embodiment, the valve members 602 on valve system 600 may be operated by a motor or, in the alternative, controlled manually.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A cooling apparatus comprising:
   a chassis including at least one fan for moving air through the chassis;
   a plurality of heat producing components each being in its component housing including airflow vents; and
   a plurality of adjustable valve systems, each adjustable valve system being adjacent a respective one of the heat producing components and each adjustable valve system being independently adjustable and comprising:
      a plurality of relatively movable plates each having alignable airflow apertures being independently movable to change the relative alignment of the airflow apertures and thereby adjusting the amount of airflow to each respective heat producing component, whereby airflow control to any component is independent of airflow control to any other component.

2. The apparatus of claim 1, further comprising:
   a control system operable to dynamically adjust each valve system in response to changing cooling needs of each respective heat producing component.

3. The apparatus of claim 1, further comprising:
   adjustment of a motor operatable to actuate adjustment of each valve system.

4. The apparatus of claim 1 wherein each valve system is operable to optimize the airflow from the fan for optimally cooling the heat producing components.

5. The apparatus of claim 1 wherein the independent adjustment includes providing increased airflow from the fan to the heat producing components producing increased heat relative to other heat producing components.

6. An information handling system (IHS) comprising:
   a chassis including at least one fan for moving air through the chassis;
   a processor mounted in the chassis;
   a memory coupled to the processor;
   a plurality of heat producing components each being in its component housing including airflow vents; and
   a plurality of adjustable valve systems, each adjustable valve system being adjacent a respective one of the heat producing components and each adjustable valve system being independently adjustable and comprising:
      a plurality of relatively movable plates each having alignable airflow apertures being independently movable to change the relative alignment of the airflow apertures and thereby adjusting the amount of airflow to each respective heat producing component, whereby airflow control to any component is independent of airflow control to any other component.

7. The IHS of claim 6, further comprising:
   a control system operable to dynamically adjust each valve system in response to changing cooling needs of each respective heat producing component.

8. The IHS of claim 6, further comprising:
   adjustment of a motor operatable to actuate adjustment of each valve system.

9. The IHS of claim 6 wherein each valve system is operable to optimize the airflow from the fan for optimally cooling the heat producing components.

10. The IHS of claim 6 wherein the independent adjustment includes providing increased airflow from the fan to the heat producing components producing increased heat relative to other heat producing components.

11. A method of cooling comprising:
    providing a chassis including at least one fan for moving air through the chassis;
    mounting a plurality of heat producing components in the chassis, each being in its component housing including airflow vents; and
    mounting a plurality of adjustable valve systems in the chassis, each adjustable valve system being adjacent a respective one of the heat producing components and each adjustable valve system being independently adjustable and comprising:
       a plurality of relatively movable plates each having alignable airflow apertures being independently movable to change the relative alignment of the airflow apertures and thereby adjusting the amount of airflow to each respective heat producing component, whereby airflow control to any component is independent of airflow control to any other component.

12. The method of claim 11, further comprising:
    a control system operable to dynamically adjust each valve system in response to changing cooling needs of each respective heat producing component.

13. The method of claim 11, further comprising:
    adjustment of a motor operatable to actuate adjustment of each valve system.

14. The method of claim 11 wherein each valve system is operable to optimize the airflow from the fan for optimally cooling the heat producing components.

15. The method of claim 11 wherein the independent adjustment includes providing increased airflow from the fan to the heat producing components producing increased heat relative to other heat producing components.

* * * * *